United States Patent [19]
Ariel et al.

[11] Patent Number: 6,091,353
[45] Date of Patent: Jul. 18, 2000

[54] BIAS CIRCUIT FOR FLASH ANALOG TO DIGITAL CONVERTER CIRCUITS

[75] Inventors: Viktor Ariel, Tel Aviv, Israel; Jungwook Yang, West Nyack, N.Y.

[73] Assignee: International Business Machines Corporation, Armonk, N.Y.

[21] Appl. No.: 09/115,899
[22] Filed: Jul. 15, 1998
[51] Int. Cl.[7] .................................................. H03M 1/36
[52] U.S. Cl. ........................................................ 341/159
[58] Field of Search ................................... 341/159, 160, 341/155

[56]  References Cited

U.S. PATENT DOCUMENTS 5,889,487   3/1999   Burns et al. ............................. 341/159
6,002,356  12/1999   Cooper .................................... 341/160

OTHER PUBLICATIONS

Error Suppressing Encoder Logic of FCDL in a 6–b Flash A/D Converter Ono et al., IEEE Journal of Solid State Circuits, vol. 32, No. 9, pp. 1460–1464, Sep. 1997.
A 400–MHZ Input Flash Converter With Error Correction, Mangelsdorf, IEEE Journal of Solid State Circuits, vol. 25, No. 1, pp 184–191, Feb. 1990.
A 10–b 300 MHZ Interpolatd–Parallel A/D Converter, Kimura et al., IEEE Journal of Solid State Circuits, vol. 28, pp. 438–446, Apr. 1993.

*Primary Examiner*—Brian Young
*Attorney, Agent, or Firm*—F. Chau & Associates, LLP

[57] ABSTRACT

A bias circuit for a flash A/D converter having a first bus line and a second bus line includes a voltage reference operatively coupled to an operational amplifier circuit. The bias circuit further includes a first transistor, a second transistor, a first load resistor and a second load resistor. The collectors of the first transistor and second transistor are coupled to a supply voltage source through the first load resistor and second load resistor, respectively. The emitters of the first and second transistors are coupled to the first and second bus lines respectively. One of the first and second bus lines is coupled to the operational amplifier, providing a signal for negative feedback. A first current bypass circuit is coupled from the supply voltage source to the first bus line and provides a first current which is substantially equal to the quiescent current of the first bus line. A second current bypass circuit is coupled from the supply voltage source to the second bus line and provides a second current. The second current is less than the quiescent current of the second bus line by a magnitude substantially equal to the load current of one comparator attached to the bus lines. The voltage on the first bus line and second bus line are substantially equal and substantially constant. A differential voltage is developed across the collectors of the first transistor and the second transistor which is responsive to a change in current in the first and second bus lines.

13 Claims, 5 Drawing Sheets

BIAS CIRCUIT FOR FLASH ANALOG TO DIGITAL CONVERTER CIRCUITS

BACKGROUND OF THE INVENTION

1. Field of the Invention

The present invention relates to flash analog to digital converters and more particularly relates to an improved bias circuit for folded cascode differential logic encoder circuits in high resolution flash A/D converters.

2. Description of the Related Art

Flash analog to digital converters (A/D) are known for use in high speed data acquisition applications. FIG. 1 is a simplified block diagram illustrating a flash A/D converter known in the prior art. In general, an input signal is applied to a network of comparator circuits 102. For an n-bit flash A/D converter, the signal is simultaneously applied to $2^n-1$ comparators. The output of the $2^n-1$ comparators 102 are applied to an encoder circuit 104 which provides n Gray code output lines. It is well known in the art of flash A/D converters that the use of Gray code encoding is preferred as this method reduces errors resulting from glitch noise, comparator metastability and bubble errors. The output of the encoder circuit 104 is then conventionally applied to a Gray code to binary converter 106 which has n-binary output lines.

FIG. 2 illustrates a known folded differential logic (FDL) circuit for Gray code encoding a six bit (n=6) flash A/D converter. In this figure, only the least significant bit ($D_0$) is illustrated. For the output line, alternating comparators 200 are connected to differential bit lines 202, 204 in a manner such that a Q output 200a of 16 comparators connects to bit line 202 and the complementary output of these comparators 200b are connected to bit line 204. An additional 16 comparators have their Q output line 200a connected to bit line 204 with their respective complimentary output lines 200b connected to bit line 202. Bias current is supplied to lines 202, 204 through resistors 206, 208 respectively. A comparator 210 is connected to bit lines 202, 204 and changes stated in response to a differential voltage across lines 202, 204. A current sink 212 is connected from bit line 202 to circuit ground.

Each comparator sinks a current $I_0$ in either the Q or the complimentary output depending on the logic state of the comparator. When an input voltage, $V_{IN}$, is applied that is below the threshold voltage of the comparator 200, all the comparators are off and a quiescent current of 16 $I_0$ is drawn in each of bit lines 202 and 204 through comparators 200. However, because of current sink 112, the total current drawn in bit line 202 is equal to $17I_0$. This provides an initial voltage differential across lines 202, 204 of $-I_0R$, which maintains comparator 210 in a logic state "0". When a voltage is applied that changes the state of one of the comparators 200, the current in bit line 202 drops from $17I_0$ to $16I_0$ while the current in bit line 204 increases from 16 $I_0$ to 17 $I_0$. The differential voltage across the comparator then becomes $I_0R$, which is detected by the comparator 210 which changes to a logic state "1" for line $D_0$.

Typically, emitter coupled logic (ECL) is used for such high speed bipolar transistor logic circuits and a differential voltage ($I_0R$) of about 400 millivolts is required. However, as the bias current for the six bit flash converter of FIG. 1 is 16 $I_0$, a minimum bias voltage of 16×400 mV=6.4v is required. This voltage exceeds the preferred supply voltage (5.2 VDC) used in the majority logic circuits. This requires either providing an additional supply voltage to the flash A/D converter or reducing the differential voltage to a value less than 400 millivolts. However, reducing the differential voltage also reduces 10 t the signal to noise ratio (SNR) of the circuit, making it more prone to errors. Therefore, the FDL logic of FIG. 2 is limited in the total number of bits which can be implemented in this topology.

FIG. 3 illustrates a folded cascode differential logic (FCDL) circuit known in the prior art which addresses the problems associated with the FDL topology of FIG. 2. The circuit of FIG. 3 is presented in the article "Error Suppressing Encode Logic of FCDL in a 6-b Flash A/D Converter" by Ono et al., IEEE Journal of Solid-State Circuits, Vol. 32, No. 9, September 1997, pp. 1460–1464. In the circuit of FIG. 3, rather than supplying 16 to 17 $I_0$ through the main bias resistors, Ono et al. teaches the use of a pair of constant current sources 300, 302 to supply a current of 18 $I_0$ to each of bit lines 202, 204. Comparator 210 is then connected to lines 202, 204 through PNP transistors 304, 306 respectively. Bias resistors 308, 310 are connected to the collectors of transistors 304, 306 and to circuit ground. As with the circuit of FIG. 2, during the quiescent state, 17 $I_0$ flows into bit line 202 and $16I_0$ flows into bit line 204. This allows 2 $I_0$ to flow through transistor 304 and resistor 308 and $I_0$ to flow through transistor 306 and resistor 310. When a comparator 200 turns on, $16I_0$ then flows in bit line 202 and 17 $I_0$ flows into line 204. In this state, $I_0$ flows through resistor 308 and $2 \cdot I_0$ flows through resistor 310 thereby creating a differential voltage that activates the comparator 210.

In the circuit of FIG. 3, only $I_0$ to 2 $I_0$ flows through the bias resistors 308, 310, thus avoiding the voltage problem associated with the FDL circuit of FIG. 2. However, the current sources 300, 302 are generally formed with PNP transistors or PMOS transistors. For high operating speeds (i.e., f>1 GHz) $I_0$ is generally on the order of several hundred micro amperes ($\mu$A), thereby requiring current sources 300, 302 to supply up to around 10 mA. However, the transconductance of PMOS transistors is generally insufficient to provide such a high drive current and may take up large area. In bipolar technologies, PNP transistors with enough β (current gain) are not generally available for this application either.

In the circuit of FIGS. 2, bit lines 202, 204 have a significant stray capacitance 214 associated therewith resulting from the large number of attached comparators 200. As the voltage on bit lines 202, 204 must change to indicate a change in logic state, this parasitic capacitance 214 adversely affects the slew rate of the device. As the resolution of the A/D is increased by one bit, the number of required comparators doubles. Therefore, the parasitic capacitance 214 quickly grows with increased resolution, thus diminishing the operating speed of high resolution devices.

Accordingly, an improved bias circuit is required for high resolution, high speed flash A/D converters. Such a bias circuit should allow operation of the flash A/D converter at conventional operating supply voltages and also reduce the slew rate effects of the parasitic capacitance on the bit lines.

SUMMARY OF THE INVENTION

A bias circuit for an FCDL encoder in a flash A/D converter having a first bus line and a second bus line includes a voltage reference operatively coupled to an operational amplifier circuit. The bias circuit further includes a first transistor, a second transistor, a first load resistor and a second load resistor. The collectors of the first transistor and second transistor are coupled to a supply voltage source through the first load resistor and second load resistor, respectively. The emitters of the first and second transistors are coupled to the first and second bus lines respectively. One of the first and second bus lines is coupled to the operational amplifier, providing a signal for negative feedback. A first current bypass circuit is coupled from the supply voltage source to the first bus line and provides a first current which is substantially equal to the quiescent current of the first encoder line. A second current bypass circuit is coupled from the supply voltage source to the second bus line and provides a second current. The second current is less than the quiescent current of the second bus line by a magnitude substantially equal to the load current of one comparator attached to the bus lines. The voltage on the first bus line and second bus line are substantially equal and substantially constant. A differential voltage is developed across the collectors of the first transistor and the second transistor which is responsive to a change in current in the first and second bus lines.

These and other objects, features and advantages of the present invention will become apparent from the following detailed description of illustrative embodiments thereof which is to be read in connection with the accompanying drawings.

BRIEF DESCRIPTION OF THE DRAWINGS

The invention will be described in detail in the following description of the preferred embodiments with reference to following figures wherein.

DETAILED DESCRIPTION OF PREFERRED EMBODIMENTS

The present invention provides a bypass current biasing circuit for a flash A/D converter. The circuits of the present invention are particularly applicable to the low order bits of high resolution flash A/D converters where many comparators are coupled to each encoder line.

Figure 1:
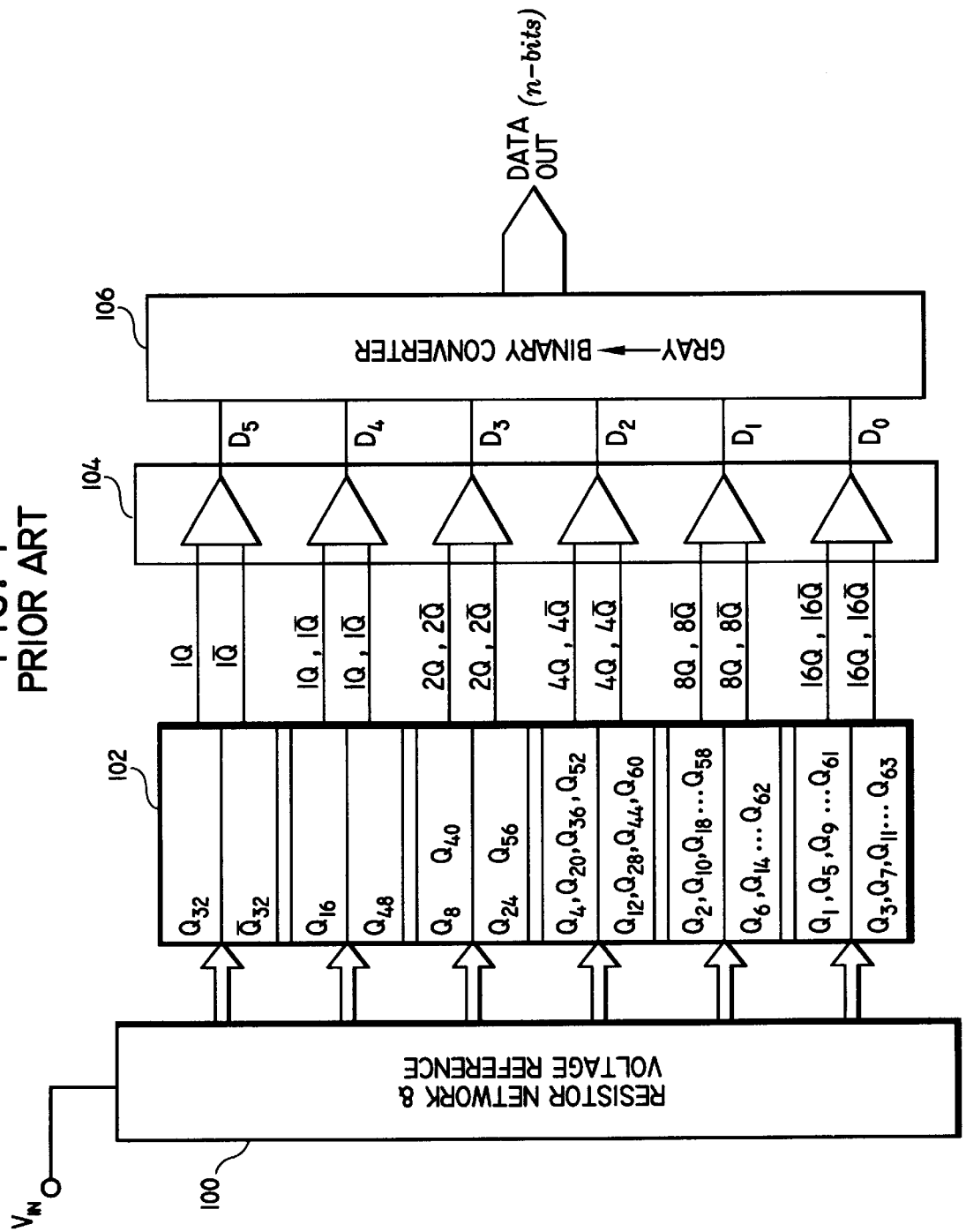
FIG. 1 is a simplified block diagram of a 6-bit flash A/D converter known in the prior art.
Figure 2:
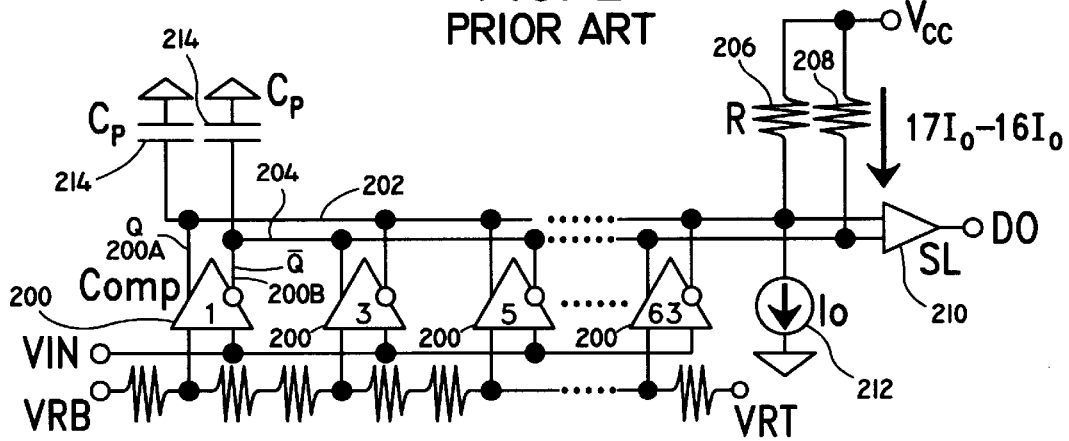
FIG. 2 is a schematic diagram of a portion of a folded differential logic (FDL) encoder circuit for a flash A/D converter, known in the prior art.
Figure 3:
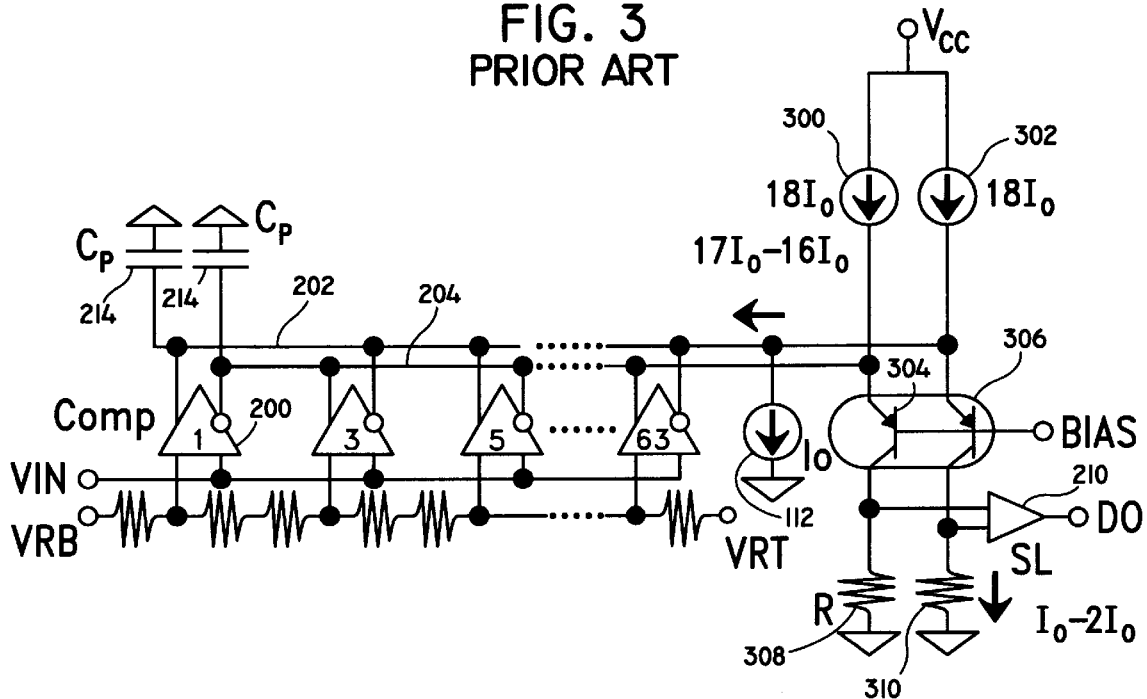
FIG. 3 is a schematic diagram of a portion of a folded cascode differential logic (FCDL) encoder circuit for a flash A/D converter, known in the prior art.
Figure 4:
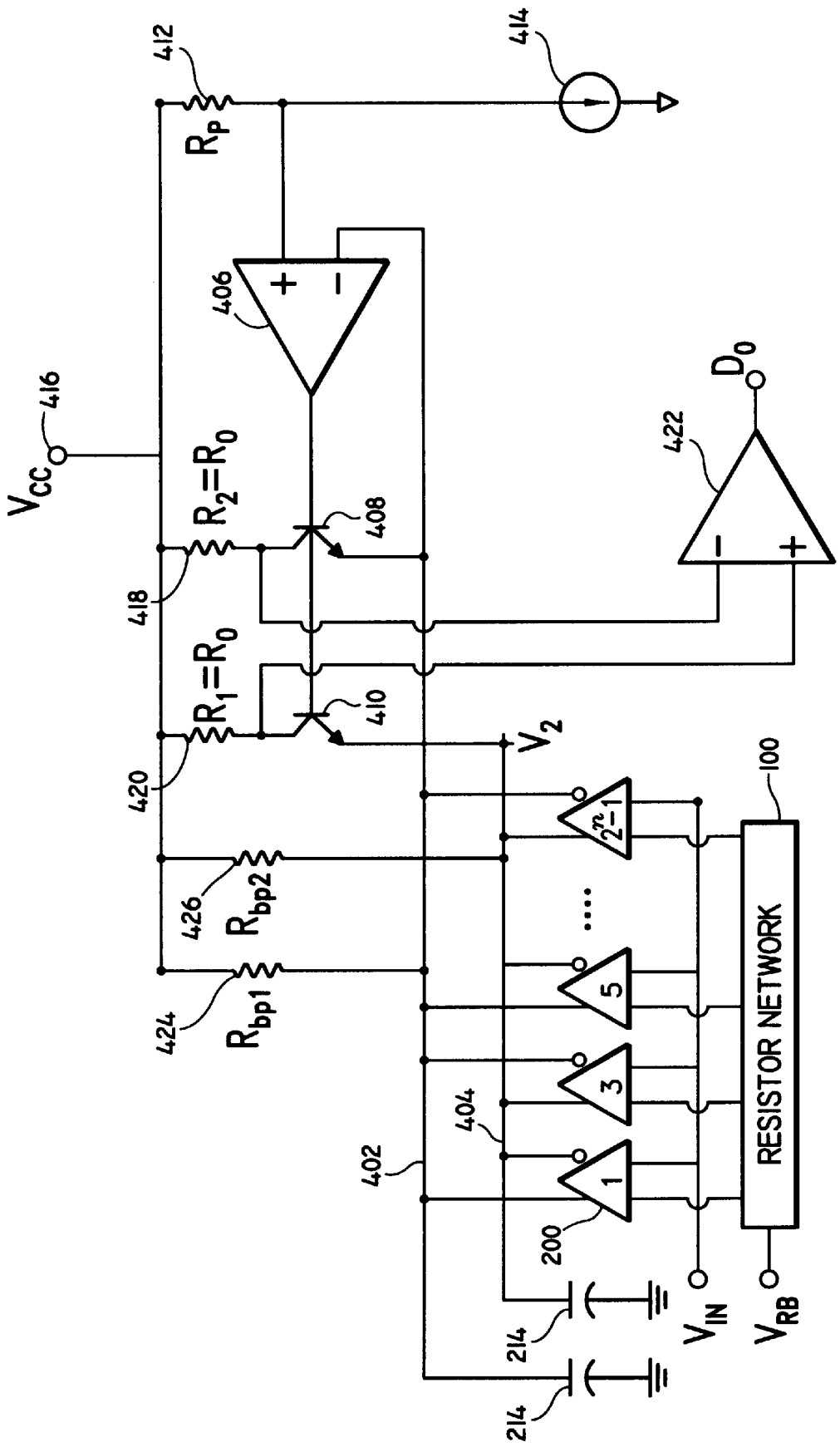
FIG. 4 is a schematic diagram of a portion of an encoder circuit for a flash A/D converter formed in accordance with the present invention, employing current bypass biasing.

A first embodiment of the present invention is illustrated in FIG. 4, which is a schematic diagram illustrating the least significant bit portion of a six bit flash A/D converter circuit. In this circuit, $2^n/2$ (32) comparators 200 are coupled to each of bus lines 402, 404 to effect Gray code encoding in a manner known in the art. Each comparator draws a current of $I_0$ in either a Q output 200A or the complimentary Q output 200B, depending on the logic state of the comparator 200. The quiescent current, i.e., all comparators off, is $16I_0$ in bus line 402 and also $16I_0$ in bus line 404. When one of the comparators 200 changes to an "on" state, the current in the first bus line 402 increases from $16I_0$ to $17I_0$ while the current in the second bus line 404 drops from $16I_0$ to $15I_0$.

A first bias circuit of the present invention includes an operational amplifier (op-amp) 406 which generates a driving voltage signal. The driving voltage signal applied to a gate terminal of a first transistor 408 and a gate terminal of a second transistor 410. The first transistor 408 has an emitter terminal coupled to the first bus line 402. The second transistor 410 has an emitter terminal which is coupled to the second bus line 404. The driving voltage signal from op-amp 406 is developed by a reference voltage $V_0$ applied to a non-inverting input terminal of op-amp 406 and a feedback signal applied to an inverting input terminal of op-amp 406. As shown, the feedback signal is received from the emitter terminal of the first transistor 408. However, the feedback signal can also be provided by the emitter of the second transistor 410 and achieve equivalent results. Preferably, the reference voltage ($V_0$) is generated by a first resistor 412 coupled between a voltage terminal ($V_{cc}$) 416 and a constant current sink 414, which is coupled to a circuit ground terminal.

The first transistor 408 and the second transistor 410 each have a collector terminal coupled to the $V_{cc}$ terminal 416 by a first load resistor 418 and a second load resistor 420, respectively. The collector terminals of the first transistor 408 and second transistor 410 are also coupled to a differential comparator circuit 422.

The bias circuit further includes a first bypass resistor 424 interposed between the $V_{cc}$ terminal 416 and the first bus line 402. A second bypass resistor 426 is interposed between the $V_{cc}$ terminal 416 and the second bus line 404. The first bypass resistor 424 is selected to have a value that will provide at least a portion of the quiescent current ($I_{b1}$) to the first bus line 402. The second bypass resistor 426 is selected to have a value that will provide a current substantially equal to the current provided by the first bypass resistor 424 less the value of one comparator load ($I_{b2} \approx I_{b1} - I_0$).

The current provided by the first bypass resistor, $I_{b1}$, preferably has a value substantially equal to $I_q - mI_0$, where $I_q$ is the quiescent current, $I_0$ is the value of one comparator load, m is a multiplier in the range $0 \leq m < 2^{n-1}/2$, and n is the number of bits in the converter. The current provided by the second bypass resistor, $I_{b2}$, is then stated as $I_{b2} \approx I_q - (m+1)I_0$.

The circuit of FIG. 4 operates in the following manner. The driving voltage from op-amp 406 biases the first transistor 408 such that the voltage on the first bus line 402 is substantially equal to the reference voltage $V_0$ established by resistor 412 and current sink 414. The feedback from the first transistor 408 to the operational amplifier 406 operates to maintain this voltage at a substantially constant value at all times. Preferably, the current sink 414 is set at a value of $I_0$ and the resistor 412 is selected to provide a desired reference voltage potential. The driving voltage from op-amp 406 is also coupled to the base of the second transistor 410. Therefore, the voltage on the second bus line 404, which is established by the second transistor 410, is substantially equal to the voltage on the first bus line 402.

Assume that the first bypass resistor 424 has a value selected to provide substantially all of the current to the first bus line 402 during the quiescent state (i.e., m=0). In this case, the first transistor 408 is substantially off and the voltage at the collector terminal of the first transistor 408 is substantially equal to that applied to the $V_{cc}$ terminal 416 ($V_{cc}$). However, as the second bypass resistor 426 is then selected to provide only a portion (15 $I_0$) of the quiescent current of the second bus line 404, the second transistor 410 conducts to provide the remaining current ($I_0$) for the second bus line 404. The voltage at the collector terminal of the second transistor 410 is then equal to $V_{cc}-V_0$, where $V_0=I_0R_0$, and $R_0$ is the value of load resistor 420. The differential voltage applied to comparator 422 maintains this comparator in an "off" condition.

When one or more of comparator 200 changes to the "on" state, the current in the first bus line 402 and second bus line 404 change in response, but the voltage on bus lines 402, 404 remains substantially constant and equal. The current in the first bus line 402 increases from $16I_0$ to $17I_0$. However, as the voltage across the first bypass resistor 424 remains constant, the current through this resistor also remains constant at $16I_0$. The additional required current ($I_0$) is then supplied by the first transistor 408. When this current flows through transistor 408, the voltage at the collector terminal drops to $V_{cc}-V_0$, where $V_0=I_0R_0$ and $R_0$ is the value of the load resistor 418. In this state, the current in the second bus line 404 drops from $16I_0$ to $15I_0$ which is substantially supplied by the second bypass resistor 426. Therefore, the second transistor 410 turns off and the collector voltage rises to a value substantially equal to $V_{cc}$. This creates a differential voltage on the input of comparator 422 which turns comparator 422 to an on state.

In a more general case where m≠0, the voltage on the collector of the first transistor 408 changes from $Vcc-mV_0$ to $Vcc-(m+1)V_0$. The voltage on the collector of the second transistor 410 then changes from $Vcc-(m+1)V_0$ to $Vcc-mV_0$, respectively. Selecting m to be a value greater than zero reduces the voltage applied the input terminals of comparator 422, which is generally preferred.

In general, when the current sink 414, which develops the reference voltage $V_0$, is selected to a value of $I_0$, the first bypass resistor 424 is given a value of about $R_p/(I_q-mI_0)$ and the second bypass resistor 426 is given a value of about $R_p/(I_q-(m+1)I_0)$, where $R_p$ is the value of resistor 412. $I_q$ is the quiescent current in the bus lines 402,404 which is equal to the load current of a single comparator ($I_0$) multiplied by the number of Q-outputs attached to the first bus line 402. The value of resistor 412 ($R_p$) is selected to provide the desired reference voltage potential, which is also equal to the voltage on the bus lines 402, 404. This voltage is equal to $V_{cc}-(I_0 \cdot R_p)$. Therefore for a given value of reference voltage, $V_0$, $R_p=(V_{cc}-V_0)/I_0$. The values of the load resistors 418, 420 are preferably equal to one another. This value is selected such that the product $I_0 \cdot R_0$ provides a sufficient differential voltage to drive comparator 422 while satisfying any signal to noise requirements of the bias circuit.

The circuit of FIG. 4 only illustrates the least significant bit ($D_0$) of a 6-bit flash A/D converter. For the $D_1$ data line, 16 comparators are employed with 8 Q outputs attached to each of the bus lines. For each successive data line, the number of comparators drop by a factor of 2. However, in the circuit of FIG. 4, regardless of the number of comparators 200 coupled to the bus lines 402, 404, a current of only $I_0$ flows through load resistors 418, 420. Therefore, the voltage supply problem encountered in the FDL circuit of the prior art is overcome. Also, the current source 414 used to develop the reference voltage is the same as those used in the comparator 200 which are generally implemented with NPN transistors. Further, because the voltage on bus lines 402, 404 remains constant, the parasitic capacitance 214 does not significantly affect the switching speed of the circuit. This allows high resolution flash A/D converters to be made for high frequency use.

Figure 5:
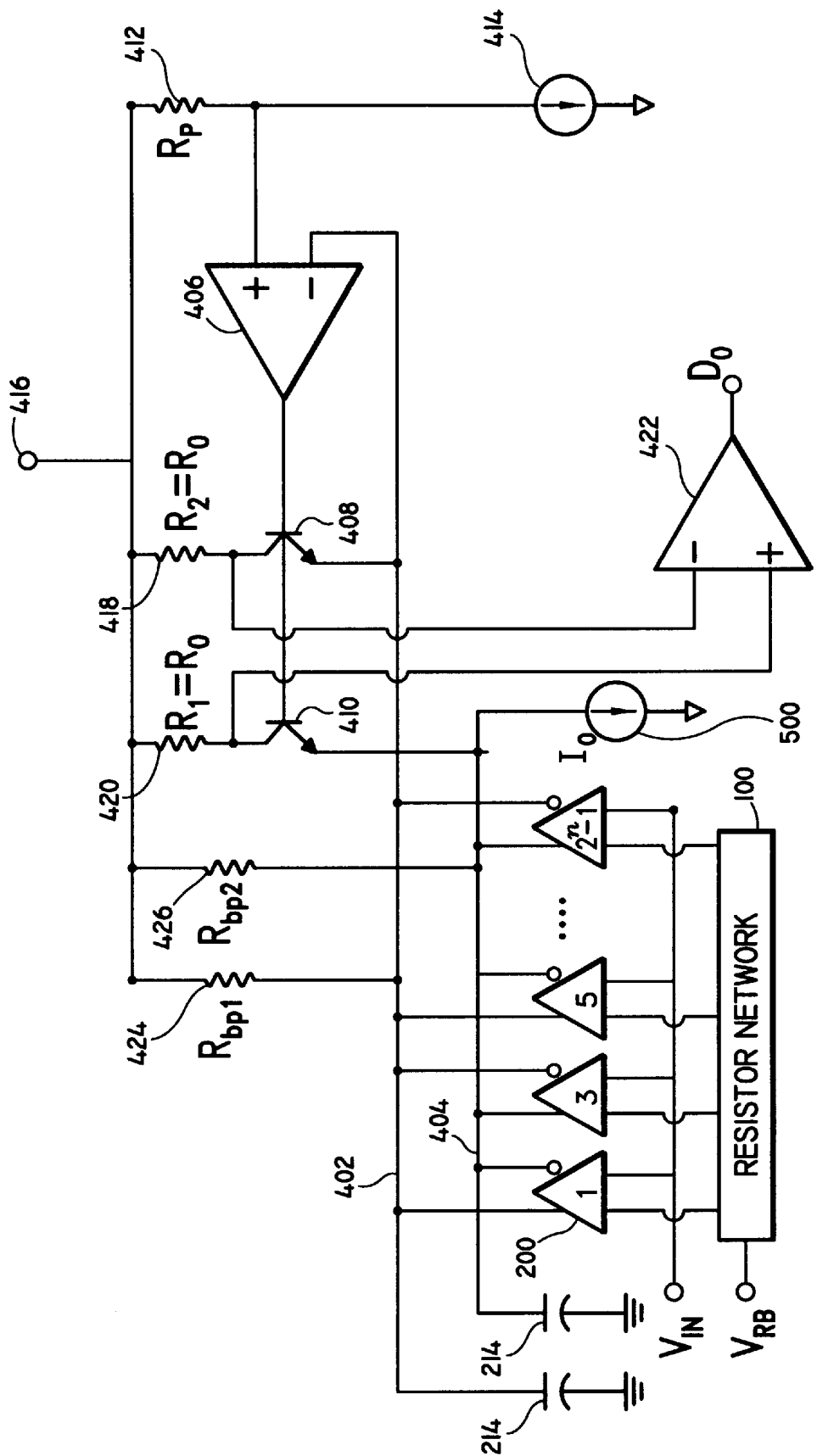
FIG. 5 is a schematic diagram of a portion of an alternate embodiment of current bypass bias circuit formed in accordance with the present invention.

FIG. 5 illustrates an alternate embodiment of a bias circuit formed in accordance with the present invention. The circuit of FIG. 5 is substantially similar to that of FIG. 4 with the exceptions that the value of the second bypass resistor 426 is changed from $R_p/(I_q-(m+1)I_0)$ to a value substantially equal to $R_p/(I_q-mI_0)$ (which is equal to the value of the first bypass resistor 424) and an offset current sink 500 is interposed between the second bus line 404 and a circuit ground terminal. The magnitude of the offset current sink 500 is $I_0$. During the quiescent state, the second bypass resistor 426 now supplies a current of $I_q-mI_0$. An additional current of $I_0$, drawn by the current sink 500, must be supplied by the second transistor 420. This effectively turns on transistor 420 in manner similar to that of FIG. 4. The remaining operation of the circuit of FIG. 5 is substantially equivalent to that described in connection with FIG. 4. This configuration generally exhibits better current matching through resistors 424 and 426 because 424 and 426 are now identical.

Figure 6:
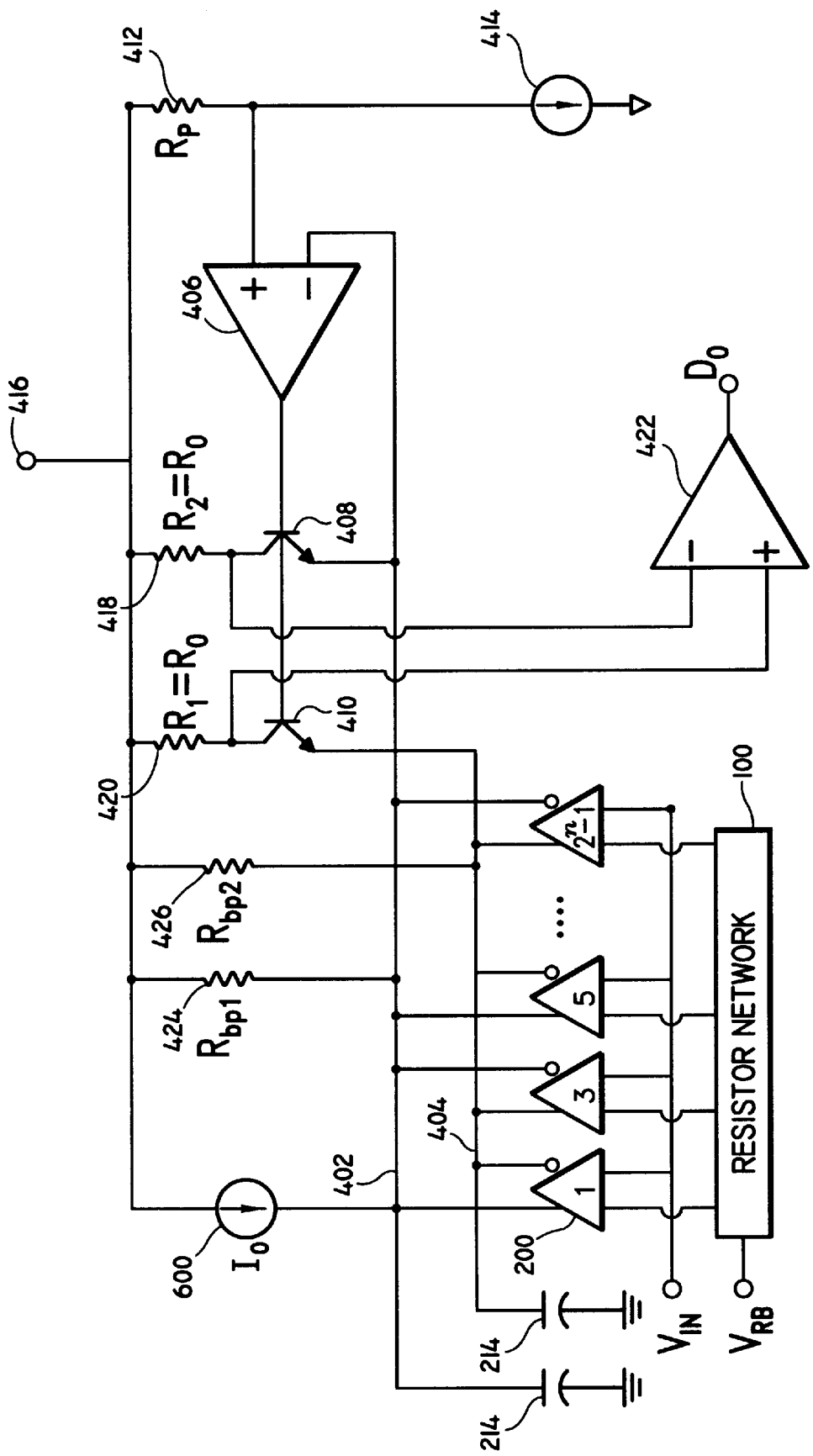
FIG. 6 is a schematic diagram of a portion of an alternate embodiment of a current bypass bias circuit formed in accordance with the present invention.

FIG. 6 illustrates another embodiment of the present invention. The circuit of FIG. 6 is substantially equivalent to that of FIG. 4 except that the value of the first bypass resistor 424 is changed from $R_p/(I_q-mI_0)$ to $R_p/(I_q-(m+1)I_0)$ (which is substantially equal to the value of the second bypass resistor 426) and a current source 600 is now interposed between the $V_{cc}$ terminal 416 and the first bus line 402. In the quiescent state (with m=0), the first bypass resistor supplies a current of $15I_0$ and the current source supplies a current of $I_0$. Accordingly, the first transistor 408 is not called upon to deliver any current and the collector voltage is substantially equal to $V_{cc}$, as in the quiescent state of the circuit of FIG. 4. The remaining operation of this circuit is substantially equivalent to that described in connection with FIG. 4. As with the circuit of FIG. 5, this configuration generally exhibits better current matching through resistors 424 and 426 than does the circuit of FIG. 4 because 424 and 426 are now identical.

It will be appreciated by those skilled in the art that various combinations of resistor values and current sources/sinks can be arranged to bypass the majority of bias current away from the load resistors 418,420. These various combinations are considered within the scope of the present invention.

The present invention is particularly well suited for use in the low order bits of a flash A/D converter. For the most significant bits of a flash A/D converter only a small number of comparators (i.e., 1, 2, 4, etc) are coupled to the bus lines 402,404. For these bits, where the bias current and the parasitic capacitance 214 are low, conventional FDL and FCDL biasing techniques can be employed in cooperation with the present invention applied to the lower order bits.

Having described preferred embodiments of the present invention, it is noted that modifications and variations can be made by persons skilled in the art in light of the above teachings. It is therefore understood that changes may be made in the particular embodiments of the invention disclosed which are within the scope and spirit of the invention as outlined by the claims.

What is claimed is:

1. A bias circuit for a flash A/D converter having a first bus line and a second bus line, each bus line having a plurality of connected comparator circuits each drawing a load current and collectively drawing a quiescent current during an off state, the bias circuit comprising:

a voltage reference circuit providing a reference voltage signal;

an operational amplifier circuit, said operational amplifier circuit receiving said reference voltage signal and providing a driving voltage signal;

a first transistor, said first transistor having a first emitter, a first base and a first collector, said first emitter being operatively coupled to the first bus line, said first base being responsive to said driving voltage signal;

a second transistor, said second transistor having a second emitter, a second base and a second collector, said second emitter being operatively coupled to the second bus line, said second base being responsive to said driving voltage signal; one of said first emitter and said second emitter being operatively coupled to said operational amplifier providing a feedback signal;

a first load resistor interposed between said first collector and a voltage source terminal;

a second load resistor interposed between said second collector and the voltage source terminal;

a first current bypass circuit interposed between the voltage source terminal and the first bus line, said first current bypass circuit selected to provide at least a portion of the quiescent current; and a second current bypass circuit interposed between the voltage source terminal and the first bus line, said second current bypass circuit selected to provide at least a portion of the quiescent current.

2. The bias circuit for a flash A/D converter as defined by claim 1, wherein one of said first current bypass circuit and said second current bypass circuit is selected to provide a current substantially equal to the quiescent current, and the other of said first current bypass circuit and said second current bypass circuit is selected to provide a current substantially equal to the quiescent current less one load current.

3. The bias circuit for a flash A/D converter as defined by claim 2, wherein said first current bypass circuit is a first bypass resistor and said second current bypass circuit is a second bypass resistor.

4. The bias circuit for a flash A/D converter as defined by claim 2, wherein said first current bypass circuit includes a first bypass resistor and a current source circuit, said current source circuit providing a current to said first bus line, said first bypass resistor being selected to provide a current substantially equal to the quiescent current less the current supplied by said current source.

5. The bias circuit for a flash A/D converter as defined by claim 2, wherein said second current bypass circuit includes a second bypass resistor and a current sink circuit, said current sink circuit drawing a current from the second bus line, said second bypass resistor providing a current substantially equal to the quiescent current.

6. The bias circuit for a flash A/D as defined by claim 1, wherein a current through said first load resistor and said second load resistor has a maximum magnitude of about one load current.

7. A bias circuit for a flash A/D converter having a first bus line and a second bus line, each bus line having a plurality of connected comparator circuits each drawing a load current and collectively drawing a quiescent current during an off state, the bias circuit comprising:

means for maintaining a first constant voltage on the first bus line;

means for maintaining a second constant voltage on the second bus line;

first current bypass means for providing at least a portion of the quiescent current to the first bus line in parallel with said first voltage maintenance means;

second current bypass means for providing at least a portion of the quiescent current to the second bus line in parallel with said second voltage maintenance means; and means for detecting a change in current in at least one of the first and second bus lines.

8. The bias circuit for a flash A/D converter as defined by claim 7 wherein one of said first current bypass means and said second current bypass means is selected to provide a current at most equal to the quiescent current, and the other of said first current bypass means and said second current bypass means is selected to provide a current substantially equal to the current through the first bypass circuit less one load current.

9. The bias circuit for a flash A/D converter as defined by claim 8, wherein said first current bypass means is a first bypass resistor and said second current bypass means is a second bypass resistor.

10. The bias circuit for a flash A/D converter as defined by claim 8, wherein said first current bypass means include a first bypass resistor and a current source circuit, said current source circuit providing a current to said first bus line, said first bypass resistor being selected to provide a current at most equal to the quiescent current less the current supplied by said current source.

11. The bias circuit for a flash A/D converter as defined by claim 8, wherein said second current bypass means includes a second bypass resistor and a current sink circuit, said current sink circuit drawing a current from the second bus line, said second bypass resistor providing a current at most equal to the quiescent current.

12. A bias circuit for a flash A/D converter having a first bus line and a second bus line, each bus line having a plurality of connected comparator circuits each drawing a load current and collectively drawing a quiescent current during an off state, the bias circuit comprising:

a voltage reference circuit providing a reference voltage signal;

an operational amplifier circuit, said operational amplifier circuit receiving said reference voltage signal and providing a driving voltage signal;

a first transistor, said first transistor having a first emitter, a first base and a first collector, said first emitter being operatively coupled to the first bus line, said first base being responsive to said driving voltage signal;

a second transistor, said second transistor having a second emitter, a second base and a second collector, said second emitter being operatively coupled to the second bus line, said second base being responsive to said driving voltage signal; one of said first emitter and said second emitter being operatively coupled to said operational amplifier providing a feedback signal;

a first load resistor interposed between said first collector and a voltage source terminal;

a second load resistor interposed between said second collector and the voltage source terminal;

a first bypass resistor interposed between the voltage source terminal and the first bus line, said first bypass resistor selected to provide at least a portion of the quiescent current; and a second bypass resistor interposed between the voltage source terminal and the first bus line, said second bypass resistor selected to provide a current substantially equal to the current provided by said first bypass resistor less one comparator load current.

13. A bias circuit for a flash A/D converter as defined by claim 12, wherein the current provided by said first bypass resistor is substantially equal to the quiescent current less an integer multiple of the comparator load current, said integer multiple being at least equal to zero and being less than the number of connected comparator circuits.

* * * * *